United States Patent
Kim et al.

(10) Patent No.: US 9,384,833 B2
(45) Date of Patent: Jul. 5, 2016

(54) MEMORY SYSTEM

(71) Applicant: SK hynix Inc., Icheon-si Gyeonggi-do (KR)

(72) Inventors: Hong Bae Kim, Seoul (KR); Jong Hoon Oh, Seongnam-si (KR); Jeong Hwan Kwon, Yongin-si (KR); Sang Kug Lym, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 165 days.

(21) Appl. No.: 14/285,775

(22) Filed: May 23, 2014

(65) Prior Publication Data
US 2015/0221370 A1    Aug. 6, 2015

(30) Foreign Application Priority Data
Feb. 3, 2014    (KR) .................. 10-2014-0012132

(51) Int. Cl.
*G11C 14/00* (2006.01)
*G11C 29/52* (2006.01)
*G11C 5/14* (2006.01)

(52) U.S. Cl.
CPC ............ *G11C 14/0018* (2013.01); *G11C 29/52* (2013.01); *G11C 5/148* (2013.01)

(58) Field of Classification Search
CPC ..... G06F 9/4418; G06F 3/0685; G11C 5/141; G11C 14/0018; G11C 29/52; G11C 5/148
See application file for complete search history.

(56) References Cited

U.S. PATENT DOCUMENTS

| | | | |
|---|---|---|---|
| 8,788,880 B1* | 7/2014 | Gosla | G11B 20/10527 714/16 |
| 2006/0069870 A1* | 3/2006 | Nicholson | G06F 1/30 711/118 |
| 2011/0095783 A1* | 4/2011 | Ferolito | G06F 13/4086 326/30 |
| 2011/0126046 A1 | 5/2011 | Hoang | |
| 2013/0117518 A1* | 5/2013 | Kobayashi | G06F 12/00 711/162 |
| 2014/0281151 A1* | 9/2014 | Yu | G06F 1/30 711/103 |

* cited by examiner

*Primary Examiner* — Hashem Farrokh
(74) *Attorney, Agent, or Firm* — William Park & Associates Ltd.

(57) ABSTRACT

The memory system includes at least one volatile memory configured to store data. The memory system also includes a non-volatile memory controller configured to provide a control signal to allow the data to be stored in a non-volatile memory during a power interruption mode. In addition, the memory system includes a termination resistor (TER) configured to control a data path in response to a power interruption signal.

18 Claims, 3 Drawing Sheets

MEMORY SYSTEM

CROSS-REFERENCE TO RELATED APPLICATION

This application claims priority based upon Korean patent application No. 10-2014-0012132, filed on Feb. 3, 2014, the disclosure of which is hereby incorporated in its entirety by reference herein.

BACKGROUND

Embodiments of the invention relate to a memory system, and more particularly to a technology for performing data interfacing between a Dynamic Random Access Memory (DRAM) and a non-volatile memory device.

Semiconductor memory devices are classified into a volatile memory device and a non-volatile memory device according to whether data is retained when a power source is cut off.

As semiconductor memory devices have been rapidly developed to be manufactured with larger capacitance and smaller sizes, DRAM devices from among volatile memory devices have been widely used and NAND flash memory devices from among non-volatile memory devices have been widely used.

In addition, DRAMs serve as volatile memory devices, such that data of the DRAMs is preliminarily provided and stored in a flash memory device when the DRAMs are powered off.

SUMMARY

In accordance with an embodiment of the invention, a memory system includes at least one volatile memory configured to store data. The memory system may also include a non-volatile memory controller configured to provide a control signal to allow the data to be stored in a non-volatile memory during a power interruption mode. In addition, the memory system may also include a termination resistor (TER) configured to control a data path in response to a power interruption signal.

In an embodiment, a memory system includes a dynamic random access memory (DRAM) configured to receive a command signal, an address, and a first power interruption signal from a non-volatile memory device and output data to a non-volatile memory controller. The memory system also includes a first termination resistor configured to receive a second power interruption signal to control a data path between the DRAM and an external host. In addition, the memory system also includes a second termination resistor configured to receive the first power interruption signal to control a data path between the DRAM and the non-volatile memory controller.

DETAILED DESCRIPTION

Reference will now be made in detail to the embodiments of the invention, examples of which are illustrated in the accompanying figures. Wherever possible, the same reference numbers will be used throughout the drawings to refer to the same or like parts. DRAM devices have to perform a power-down operation and a refresh operation according to unique characteristics of the DRAM devices. For example, the DRAM devices have to enter the power-down mode (i.e., have to perform the power-down operation) so as to minimize power consumption when the DRAM devices are not used for a predetermined time or longer. DRAM devices have to enter the refresh mode (i.e., have to perform the refresh operation) so as to prevent data from being lost by natural leakage of data stored in a capacitor of a memory cell. The NAND flash memory devices do not support an overwriting operation in a different way from a hard disc drive (HDD). Accordingly, an "erase before write operation" operation must be carried out on a block basis and a background operation depending upon unique characteristics of the NAND flash memory device should be carried out. The background operation may include a garbage collection operation for efficiently processing valid pages and invalid pages and a wear-leveling operation for averaging abrasion degrees of memory cells. For example, the garbage collection operation may include a merge operation, a compaction operation, and the like. If DRAM data is transferred to the flash memory device, the DRAM data passes through a switching element, resulting in an increase of data transmission latency. In addition, all data output ports of the memory are used, such that a routing is added and complexity is also increased. As a result, production costs of a module Printed Circuit Board (PCB) are unavoidably increased and a plurality of active elements needs to be mounted to the module PCB. Further, increased production costs of the module may occur. Various embodiments of the invention are directed to providing a memory system that substantially obviates one or more problems due to limitations and disadvantages of the related art. Embodiments of the invention relates to a technology that can simplify an interfacing path when data interfacing is performed between a DRAM and a non-volatile memory device, resulting in reduction of data latency.

Figure 1:
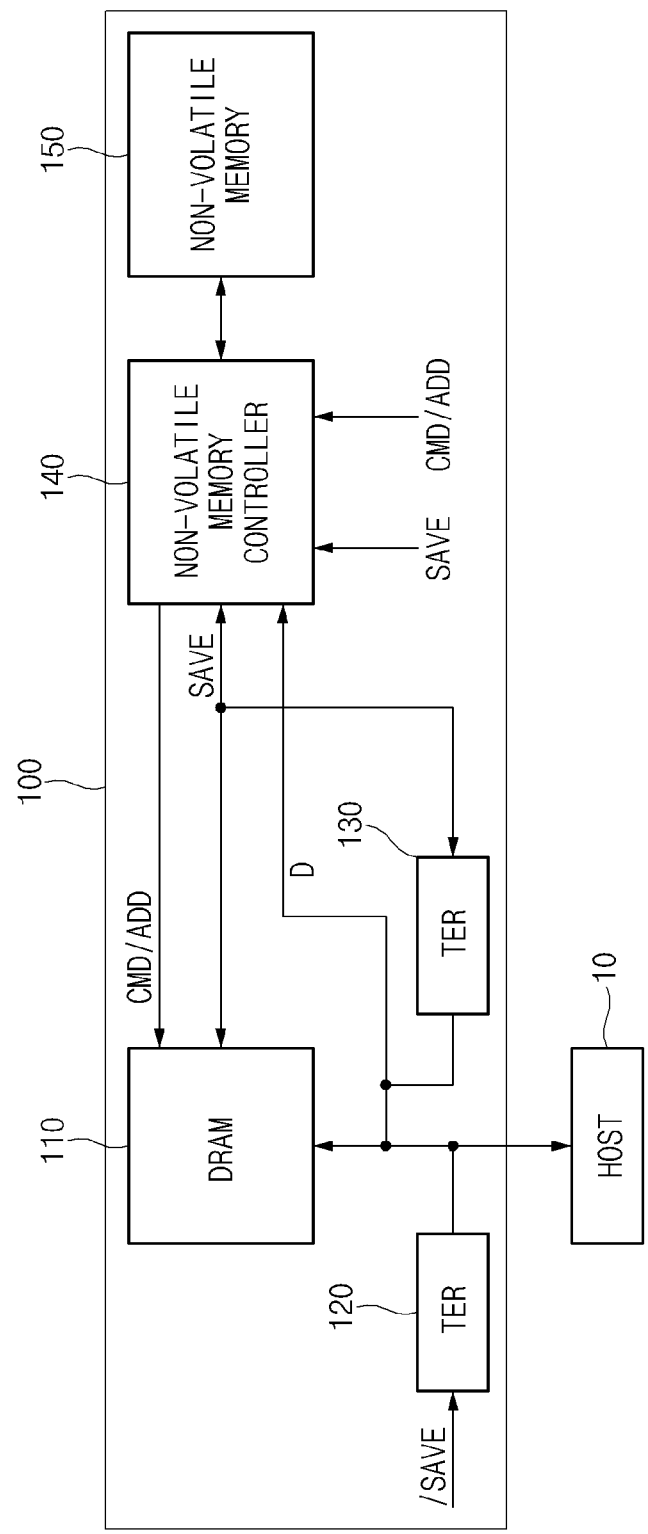
FIG. 1 is a block diagram illustrating a memory system according to an embodiment.

Referring to FIG. 1, a block diagram of memory system is illustrated. The memory system 100 according to an embodiment includes a DRAM 110, a plurality of termination resistors (TERs) (120, 130), a non-volatile memory controller 140, and a non-volatile memory 150.

In an embodiment the DRAM 110 exchanges data with an external host 10. The DRAM 110 is electrically coupled to the external host 10 on the basis of DRAM interfacing, and is then operated. More specifically, the DRAM 110 may operate on the basis of a DRAM interface command generated from the host 10.

The DRAM 110 may receive a read command of the DRAM device 120 from the host 10 to perform a data read operation. The DRAM 110 may also perform a data write operation upon receipt of a write command for the DRAM 110. In addition, the external host 10 may be configured to provide an interruption signal (SAVE) to the memory system 100 by detecting power interruption when powered off.

The DRAM 110 receives a command signal (CMD), an address (ADD), and a power interruption signal (SAVE) from a non-volatile memory device 150. Accordingly, the DRAM 110 outputs data (D) to the non-volatile memory controller 140.

Although an embodiment of the invention has disclosed the DRAM as an example of a non-volatile memory, the scope or spirit of the invention is not limited thereto. Moreover, the memory device of embodiments may also be composed of other volatile memories other than the DRAM. In addition, there is no limitation in memory categories. Further, although an embodiment of the invention has disclosed that one DRAM 110 is contained in the memory system for convenience of description, the scope or spirit of the invention is not limited thereto. The memory system of an embodiment may include a plurality of DRAMs or volatile memories.

The termination resistor (TER) 120 receives a power interruption signal (/SAVE) as input so that it controls a data path between the DRAM 110 and the host 10. The TER 130 may control a data path between the DRAM 110 and the non-volatile memory controller 140 upon receiving a power interruption signal (SAVE) from the non-volatile memory controller 140. In this situation, the power interruption signal (/SAVE) may be an inversion signal of the power interruption signal (SAVE).

Here, the TERs (120, 130) may correspond to On Die Termination (ODT) resistors. As a result of the TERs (120, 130), resistance values of the TERs (120, 130) of I/O signals are adjusted when the memory device is integrated on a printed circuit board (PCB) or the like. Accordingly, data can be applied to other chips without impedance inconsistency.

The TERs (120, 130) may be integrated into a board such as a PCB, such that the number of layers of the PCB is reduced. The TERs (120, 130) being integrated into a PCB may result in a reduction of PCB costs and module costs.

The non-volatile memory controller 140 receives a power interruption signal (SAVE), a command signal (CMD), and an address (ADD) from an external part. Consequently, the non-volatile memory controller 140 controls interfacing between the DRAM 110 and the non-volatile memory 150.

More specifically, the non-volatile memory controller 140 outputs the command signal (CMD), the address (ADD), and the power interruption signal (SAVE) to the DRAM 110. The non-volatile memory controller 140 also receives data (D) from the DRAM 110, and outputs the power interruption signal (SAVE) to the TERs (120, 130). The non-volatile memory controller 140 outputs the data D received from the DRAM 110 to the non-volatile memory 150.

In this instance, if the power interruption signal (SAVE) is activated (e.g., is activated to a low level) during the power interruption mode, data (D) stored in the DRAM 110 acting as a volatile memory is applied to the non-volatile memory 150. The data is applied to the non-volatile memory 150 in response to a control signal of the non-volatile memory controller 140. As a result, the data (D) can be preliminarily stored in the non-volatile memory 150. Accordingly, data of the DRAM 110 acting as a volatile memory can be retained through the volatile memory 150 even when a power source is cut off. In this case, during the normal mode instead of a power interruption mode, only the DRAM 110 operates and the non-volatile memory 150 accordingly does not operate.

The non-volatile memory 150 according to an embodiment may include a flash memory. However, the scope or spirit of the invention is not limited thereto. Further there is no limitation in non-volatile memory categories.

Figure 2:
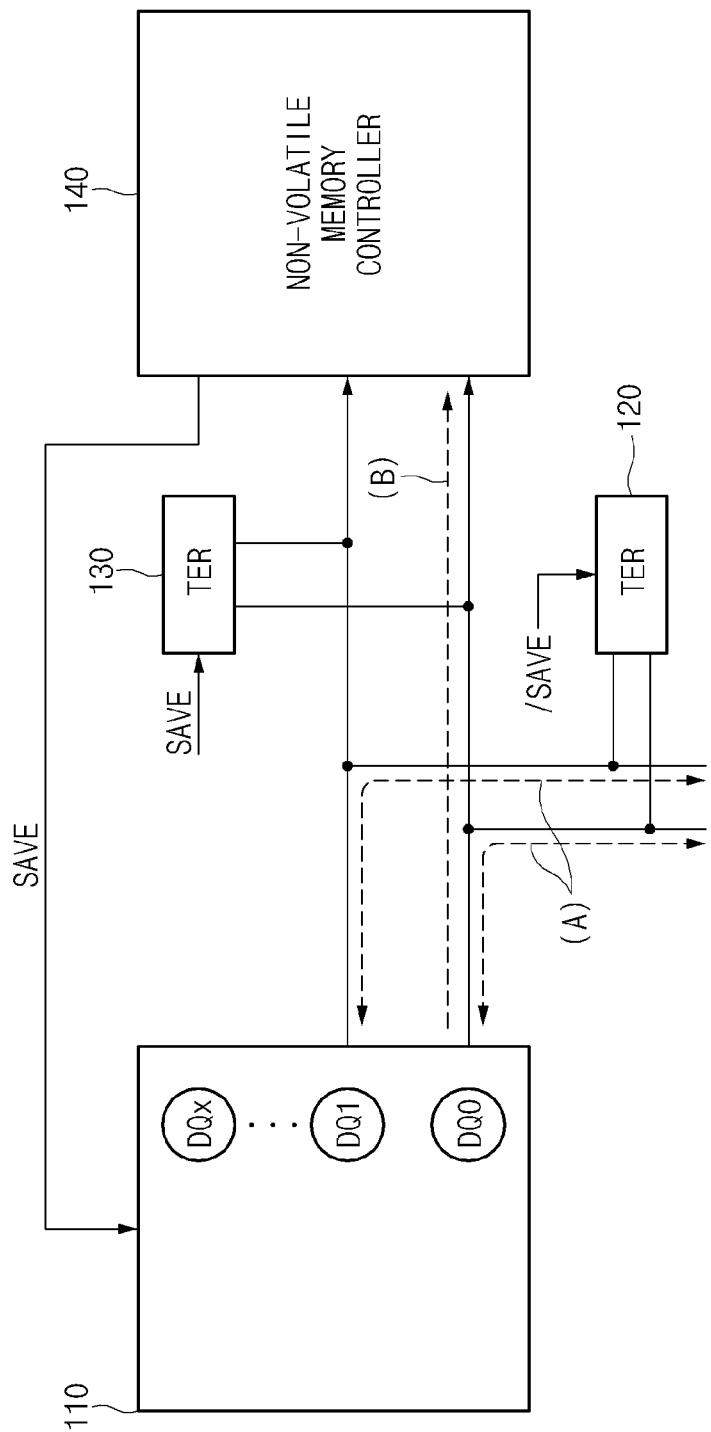
FIG. 2 is a conceptual diagram illustrating a data transfer path shown in FIG. 1.

Referring to FIG. 2, a conceptual diagram illustrating a data transfer path is shown. The DRAM 110 includes a plurality of data pins (DQ0~DQx). One data pin (DQ0) from among the data pins (DQ0~DQx) may be established as a default data pin for power interruption. The remaining data pins (DQx) are then not used.

The DRAM 110 outputs data (D) to the non-volatile memory controller 140 through one data pin (DQ0). To increase a data transfer rate, data may be applied to the non-volatile memory controller 140 using an additional option data pin (DQ1).

The above-mentioned case of increasing the data transfer rate may correspond to an operation for rapid data dumping. In such a situation, the option data pin (DQ1) may be additionally used.

For instance, an embodiment of the invention may output 64-bit data to the non-volatile memory controller 140. Moreover, a full data burst through the default data pin (DQ0) may be used.

In this instance, the DRAM 110 may output 64-bit data serving as serial data to the non-volatile memory controller 140.

An embodiment of the invention may output 32-bit data having a half burst size to the non-volatile memory controller 140 using the additional option data pin (DQ1).

In such a situation, the DRAM 110 may output 32-bit data serving as serial data to the non-volatile memory controller 140. More specifically, the option data pin (DQ1) may have the size of half data of a default data pin (DQ0).

Further, the TER 120 is complementary to the TER 130.

In response to the power interruption signal (/SAVE), the TER 120 is turned off during the normal operation mode. The TER 120 is then turned on during the power interruption mode. For example, the power interruption signal (/SAVE) goes to a low level during the normal operation mode. The power interruption signal (/SAVE) also goes to a high level during the power interruption mode.

In response to the power interruption signal (SAVE), the TER 130 is turned on during the normal operation mode. The TER 130 is then turned off during the power interruption mode. For instance, the power interruption signal (SAVE) goes to a high level during the normal operation mode. In addition, the power interruption signal (SAVE) goes to a low level during the power interruption mode.

Therefore, in response to the power interruption signal (SAVE) during the normal operation mode, the TER 130 is turned on, and the TER 120 is turned off.

As a result, during the normal operation mode, the turned-on TER 130 operates as a resistor. Further, a data transfer path between the DRAM 110 and the non-volatile memory controller 140 is cut off.

Accordingly, during the normal operation mode, output data of the DRAM 110 is transferred to the external host 10 through a path (A).

During the normal operation mode, data received from the external host 10 is input to the DRAM 110 through the path (A).

On the other hand, in response to the power interruption signal (/SAVE) during the power interruption mode, the TER 120 is turned on and the TER 130 is turned off. Therefore, during the power interruption mode, the turned-on TER 120 operates as a resistor. In addition, a data transfer path between the DRAM 110 and the external host 10 is cut off.

Accordingly, during the power interruption mode, output data of the DRAM 110 is transferred to the non-volatile memory controller 140 through a path (B). Further, during the power interruption mode, the non-volatile memory controller 140 receives a command signal (CMD) and an address (ADD) from an external part. As a result, the non-volatile memory controller 140 can control the non-volatile memory 150.

Figure 3:
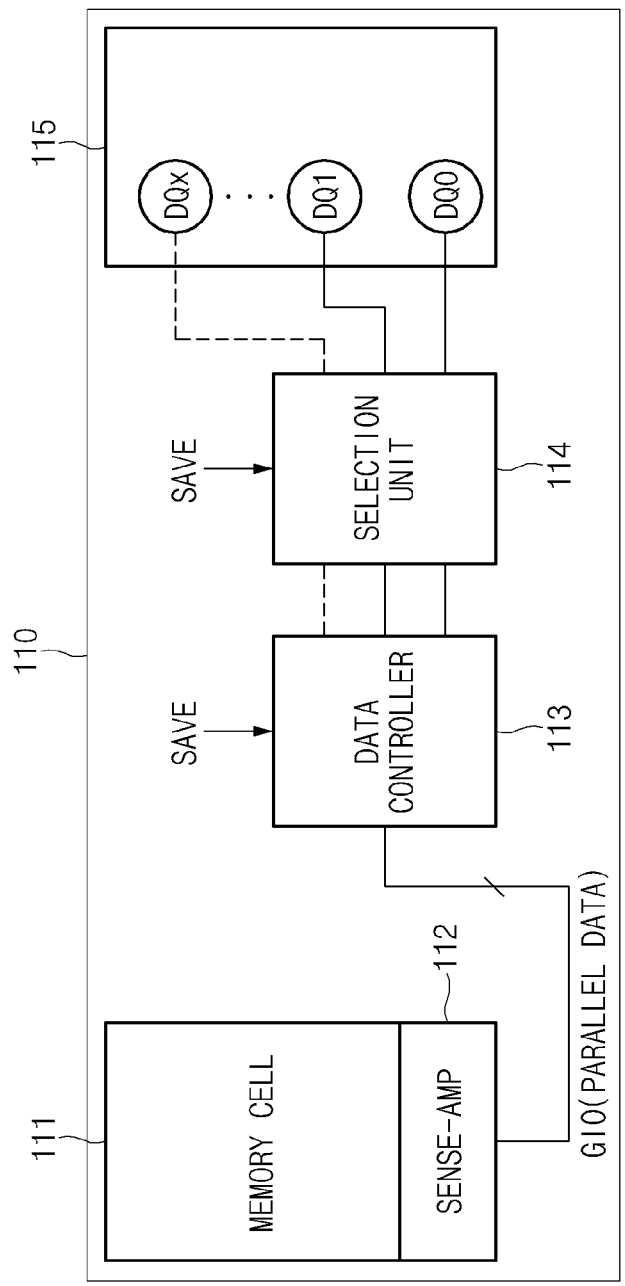
FIG. 3 is a block diagram illustrating an internal construction of a DRAM shown in FIG. 1.

Referring to FIG. 3, a block diagram of an internal construction of the DRAM 110 is shown. The DRAM 110 includes a memory cell 111, a sense-amplifier (sense-amp) 112, a data controller 113, a selection unit 114, and an output unit 115.

Data stored in the memory cell 111 is sensed and amplified by the sense-amplifier 112. As a result, the amplified data is output to a global I/O (GIO) line. Parallel data output to the GIO line is output to the data controller 113.

The data controller 113 may include a pipe and a latency controller.

The pipe latch converts parallel data into serial data to perform data compression. The latency controller may control a duration time from a reception time of the data output command to an output time of actual serial data.

In response to the power interruption signal (SAVE), the data controller 113 converts parallel data received from the GIO line into serial data to perform data compression.

The selection unit 114 may output an output port of the data controller 114 in response to the power interruption signal (SAVE).

More specifically, the selection unit 114 may select a predetermined number of parallel ports corresponding to parallel data during the normal operation mode. Further, the selection unit 114 may select one port or dual port corresponding to serial data during the power interruption mode.

Accordingly, the data controller 113 may output parallel data received from the GIO line to the selection unit 114 during the normal operation mode.

If the power interruption signal (SAVE) is deactivated (if the power interruption signal (SAVE) is deactivated to a high level) during the normal operation mode, the selection unit 114 may then select all the data pins (DQ0~DQx) of the output unit 115. Therefore, parallel data may be output through all the data pins (DQ0~DQx).

If the power interruption signal (SAVE) is activated (for example, if the power interruption signal (SAVE) is activated to a low level) during the power interruption mode, the data controller 113 converts parallel data into serial data to control a data latency. The parallel data may be received from the GIO line.

If the power interruption signal (SAVE) is activated (for example, if the power interruption signal (SAVE) is activated to a low level) during the power interruption mode, the selection unit 114 selects one default data pin (DQ0). Accordingly, serial data may be output through the default data pin (DQ0).

In this instance, the DRAM 110 may transmit data (D) to one port of the non-volatile memory controller 140 through the default data pin (DQ0).

In addition, to increase a data transfer rate, the DRAM 110 additionally uses the option data pin (DQ1) of the output unit 115. Consequently, the DRAM 110 outputs data (D) to the non-volatile memory controller 140 through a dual port.

As is apparent from the above description, the memory system according to the embodiments has the following effects.

The memory device according to the embodiments can transmit data without passing through a Field Effect Transistor (FET). As a result, a reduction of latency needed for data transmission may occur.

The memory device according to the embodiments reduces a width of data transferred between memories, serializes the data, and transmits the serialized data. Accordingly, an interface structure may be simplified.

The memory device according to the embodiments may reduce the number of layers of a Printed Circuit Broad (PCB). Accordingly, a reduction in PCB costs may occur.

The memory device according to the embodiments controls an interface path using termination resistance. As a result, a reduction of module costs may occur.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents. The scope should not be limited by the above description. In addition, all changes coming within the meaning and equivalency range of the appended claims are intended to be embraced therein. Further, it is obvious to those skilled in the art that claims not explicitly cited in each other in the appended claims may be presented in combination as an embodiment of the invention. Moreover, the claims not explicitly cited in each other in the appended claims may be included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. More specifically, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:
at least one volatile memory configured to store data;
a non-volatile memory controller configured to provide a control signal to allow the data to be stored in a non-volatile memory during a power interruption mode; and
a termination resistor (TER) configured to control a data path in response to a power interruption signal,
wherein the termination resistor includes:
a first termination resistor electrically coupled between the volatile memory and an external host; and
a second termination resistor electrically coupled between the volatile memory and the non-volatile memory controller,
wherein the first termination resistor is complementary to the second termination resistor.

2. The memory system according to claim 1, wherein the volatile memory includes a DRAM.

3. The memory system according to claim 1, wherein the non-volatile memory includes a flash memory.

4. The memory system according to claim 1, wherein the first termination resistor is turned on during the power interruption mode and the second resistor is turned on during a normal operation mode.

5. The memory system according to claim 1, wherein the first termination resistor is turned on during the power interruption mode, to form a data transfer path between the volatile memory and the non-volatile memory controller.

6. The memory system according to claim 5, wherein the data transfer path between the volatile memory and the external host is cut off during the power interruption mode.

7. The memory system according to claim 1, wherein the second termination resistor is turned off during the power interruption mode and the first termination resistor is turned off during a normal operation mode.

8. The memory system according to claim 1, wherein the second termination resistor is turned on during a normal operation mode, to allow a data transfer path between the volatile memory and the host to be formed.

9. The memory system according to claim 8, wherein the data transfer path between the volatile memory and the non-volatile memory controller is cut off during the normal operation mode.

10. The memory system according to claim 1, wherein the volatile memory includes:
  a data controller configured to convert parallel data into serial data in response to the power interruption signal to perform data compression;
  a selection unit configured to select an output port of the data controller during the power interruption mode; and
  an output unit configured to output serial data received from the selection unit through one data pin.

11. The memory system according to claim 10, wherein the data controller includes:
  a pipe latch configured to convert the parallel data into serial data to perform the data compression; and
  a latency controller configured to control an output time of the serial data.

12. The memory system according to claim 10, wherein the output unit further includes:
  an option data pin configured to output the serial data in a different way from the data pin such that the volatile memory outputs data to the non-volatile memory controller through a dual port.

13. The memory system according to claim 12, wherein the option data pin has a size of half data of the data pin.

14. The memory system according to claim 10, wherein the selection unit selects a plurality of output ports corresponding to the parallel data during the normal operation mode.

15. The memory system according to claim 1, wherein:
  during the power interruption mode, the non-volatile memory controller receives a command signal and an address from an external part, and controls interfacing between the volatile memory and the non-volatile memory using the received command signal and address.

16. A memory system comprises:
  a dynamic random access memory (DRAM) configured to receive a command signal, an address, and a first power interruption signal from a non-volatile memory device and output data to a non-volatile memory controller;
  a first termination resistor configured to receive a second power interruption signal to control a data path between the DRAM and an external host; and
  a second termination resistor configured to receive the first power interruption signal to control a data path between the DRAM and the non-volatile memory controller,
  wherein the first termination resistor is complementary to the second termination resistor.

17. The memory system according to claim 16, wherein the non-volatile memory controller receives the first power interruption signal, the command signal, and the address to control an interfacing between the DRAM and the non-volatile memory device.

18. The memory system according to claim 16, wherein when the first power interruption signal is activated during a power interruption mode, the data stored in the DRAM is applied to the non-volatile memory device in response to a control signal of the non-volatile memory controller to allow the data to be stored in the non-volatile memory device.

* * * * *